United States Patent
Haggard et al.

(10) Patent No.: US 6,988,620 B2
(45) Date of Patent: Jan. 24, 2006

(54) CONTAINER WITH AN ADJUSTABLE INSIDE DIMENSION THAT RESTRICTS MOVEMENT OF ITEMS WITHIN THE CONTAINER

(75) Inventors: Clifton C. Haggard, Austin, TX (US); James R. Thomas, Austin, TX (US); Song Ping Chen, ShenZhen (CN); Ru Zheng Liu, ShenZhen (CN)

(73) Assignee: e.PAK International, Inc., Austin, TX (US)

( * ) Notice: Subject to any disclaimer, the term of this patent is extended or adjusted under 35 U.S.C. 154(b) by 434 days.

(21) Appl. No.: 10/386,385

(22) Filed: Mar. 11, 2003

(65) Prior Publication Data

US 2004/0045263 A1 Mar. 11, 2004

Related U.S. Application Data

(60) Provisional application No. 60/408,850, filed on Sep. 6, 2002.

(51) Int. Cl.
*B65D 85/00* (2006.01)

(52) U.S. Cl. ..................................................... 206/710
(58) Field of Classification Search ................. 206/303, 206/701, 706, 710, 711, 714, 715, 722, 723, 206/724, 725
See application file for complete search history.

(56) References Cited

U.S. PATENT DOCUMENTS

| | | | | |
|---|---|---|---|---|
| 4,858,764 A | * | 8/1989 | Domokos | 206/449 |
| 5,240,753 A | * | 8/1993 | Tabuchi et al. | 428/36.4 |
| 5,351,836 A | * | 10/1994 | Mori et al. | 211/41.18 |
| 5,402,890 A | | 4/1995 | Yajima et al. | |
| 5,476,176 A | * | 12/1995 | Gregerson et al. | 206/711 |
| 5,533,711 A | * | 7/1996 | Pickrell | 254/273 |
| 5,836,454 A | | 11/1998 | Evers | |
| 5,909,812 A | | 6/1999 | Thibaudeau | |
| 5,988,393 A | * | 11/1999 | Hsia et al. | 206/711 |
| 6,056,123 A | * | 5/2000 | Niemirowski et al. | 206/711 |
| 6,193,068 B1 | | 2/2001 | Lewis et al. | |
| 6,234,316 B1 | | 5/2001 | Hsieh et al. | |
| 6,247,597 B1 | * | 6/2001 | Sato | 206/710 |
| 6,286,684 B1 | | 9/2001 | Brooks et al. | |
| 6,491,177 B1 | * | 12/2002 | Hyobu | 220/4.01 |
| 6,564,946 B2 | * | 5/2003 | Lewis et al. | 206/710 |

FOREIGN PATENT DOCUMENTS

FR  2819794  7/2002

* cited by examiner

*Primary Examiner*—Kurt Fernstrom
(74) *Attorney, Agent, or Firm*—Carlson, Gaskey & Olds

(57) ABSTRACT

A container for packaging items such as semiconductor wafers has a restraining portion with a changeable dimension at an open end that facilitates using conventional loading techniques while also more securely containing the items to avoid undesirable movement of the items in the container. In one example embodiment, the restraining portion includes a sidewall portion that has a first, nominal inside dimension at one end. A second end of the sidewall portion has a second, greater inside dimension at an open end. Another member of the container cooperates with the sidewall portion to change the inside dimension at the open end from the second, greater dimension to the first, nominal dimension. The nominal dimension is selected to correspond to an exterior dimension of the items to be contained within the package so that the container maintains the items in a secure alignment that eliminates lateral movement of the items once the container is secured.

17 Claims, 4 Drawing Sheets

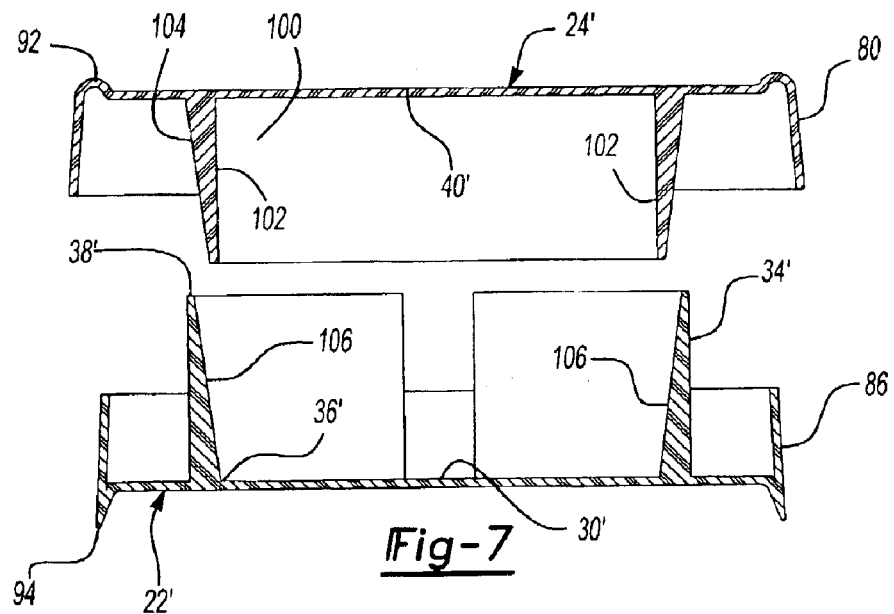
*Fig-7*
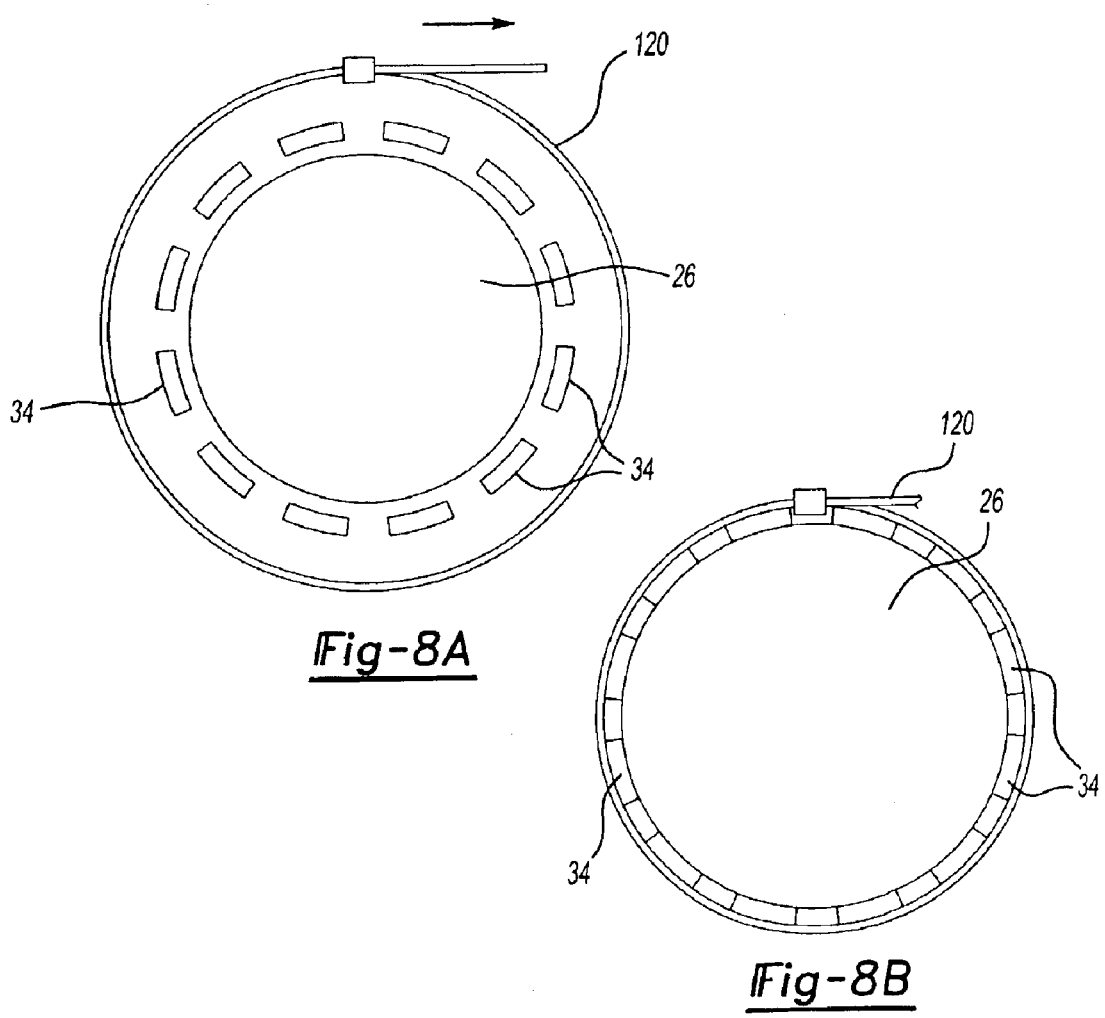
*Fig-8A*
*Fig-8B*

CONTAINER WITH AN ADJUSTABLE INSIDE DIMENSION THAT RESTRICTS MOVEMENT OF ITEMS WITHIN THE CONTAINER

CROSS REFERENCE TO RELATED APPLICATIONS

This application claims priority to U.S. Provisional Application No. 60/408,850, which was filed on Sep. 6, 2002.

FIELD OF THE INVENTION

This invention generally relates to containers for packaging items such as semiconductor wafers. More particularly, this invention relates to containers having an adjustable inside dimension that restricts movement of the contents within the container.

DESCRIPTION OF THE RELATED ART

A variety of containers are available for packaging various items during shipping and handling. Depending on the nature of the items, container designs vary. In the case of semiconductor wafers, for example, packaging must securely contain the wafers to avoid damage during shipping and handling. There must be adequate cushion to absorb impacts. The wafers also must be securely contained to avoid relative movement between the wafers. Regardless of the cushioning approach used, lateral movement between the wafers must be minimized (and ideally is eliminated) to ensure the integrity of the wafers throughout handling and shipping.

A difficulty is introduced by the conventional manner in which containers are filled with wafers. Manual or semi-automated loading techniques require a container having an inside dimension that is greater than the outside dimension of the wafers to facilitate insertion of the wafers into the container. There necessarily is a gap between the inside of the container and the outside of the wafers that eventually allows for lateral movement of the wafers within the container.

One approach at minimizing such movement has been to include a plurality of foam cushions within the container to axially restrict wafer movement and to apply pressure that tends to resist lateral movement. Such arrangements, however, have proven ineffective under many circumstances.

There is a need for an improved container that more securely and reliably maintains delicate items, such as semiconductor wafers, in a desired alignment and secure position within the container throughout shipping and handling. This invention addresses that need while avoiding the shortcomings and drawbacks of the prior art.

SUMMARY OF THE INVENTION

In general terms, this invention is a container for packaging items such as semiconductor wafers that eliminates undesirable movement of the items within the container.

One example container designed according to this invention includes a first member that has an endwall. A sidewall portion extends from the endwall. The sidewall portion has a nominal inside dimension adjacent the endwall. The nominal inside dimension corresponds to an outside dimension of the items to be placed within the container. The sidewall portion has a greater inside dimension at a second end distal from the endwall. The larger dimension at the distal end facilitates inserting the items into the container. A second member cooperates with the sidewall portion of the first member to establish the nominal dimension at the second end after the items are loaded. The cooperation between the first and second members establishes a secure containment of the items that eliminates undesirable movement of the items once they are securely maintained within the container.

In one example, the sidewall portion is at least partially moveable so that the distal end of the sidewall portion moves between a first position corresponding to the larger dimension and a second position corresponding to the nominal dimension. The second member in one example comprises a sidewall that is received around an outside of the first member sidewall to draw the distal ends inward to establish the nominal dimension at the distal end. In a preferred arrangement, the first member sidewall is drawn into the position where the nominal dimension exists at both ends of the sidewall portion simultaneous with closing the container.

The various features and advantages of this invention will become apparent to those skilled in the art from the following detailed description of the currently preferred embodiment. The drawings that accompany the detailed description can be briefly described as follows.

BRIEF DESCRIPTION OF THE DRAWINGS

FIG. 7 is a cross-sectional illustration of an alternative embodiment of a container designed according to this invention.

FIG. 8A is an elevational view of selected portions of an alternative embodiment in a first condition.

FIG. 8B is an elevational view of the embodiment of FIG. 8A in a second condition.

DETAILED DESCRIPTION OF THE PREFERRED EMBODIMENT

Figure 1:
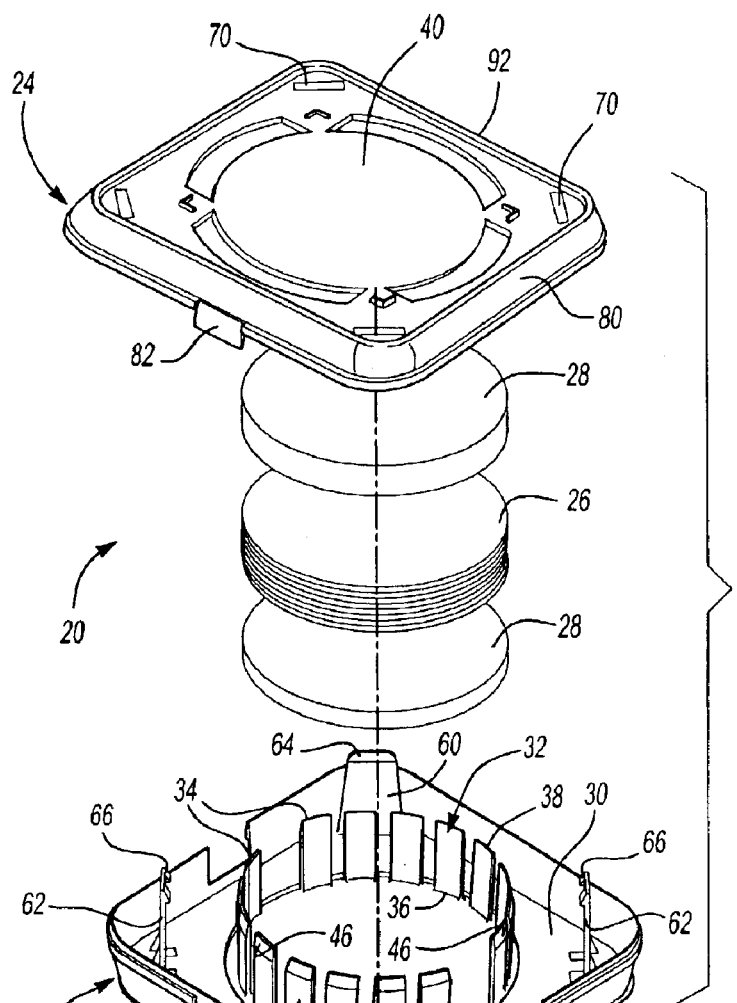
FIG. 1 is a perspective, exploded view diagrammatically illustrating an example container designed according to this invention.
Figure 1:
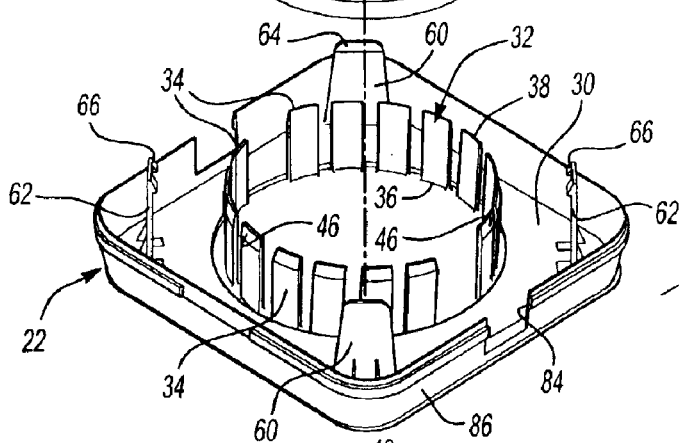

FIG. 1 diagrammatically illustrates a container assembly 20. A first member 22 cooperates with a second member 24 to securely package and contain a plurality of items 26, which are semiconductor wafers in this example. Packaging cushions 28 are provided on opposite ends of the stack of wafers 26 to cushion the wafers within the container in a conventional manner.

The first member 22 is a bottom or base of the container in this illustration. The base 22 includes an endwall 30 that establishes one axial end of the container 20. A sidewall portion 32 extends from the endwall 30. In this example, the sidewall portion 32 comprises a plurality of extensions 34.

The sidewall portion 32 has a first, nominal dimension (i.e., diameter) at an end 36 of the sidewall portion 32 adjacent the endwall 30. The inside dimension preferably is set so that it corresponds to an outside dimension of the wafers 26 that are received within the container 20. A distal end 38 of the sidewall portion 32 has a second, greater inside dimension (i.e., diameter). The larger dimension at the distal, open end of the sidewall portion 32 facilitates inserting the wafers 26 and packaging cushions 28 into the container using conventional loading techniques.

Figure 2:
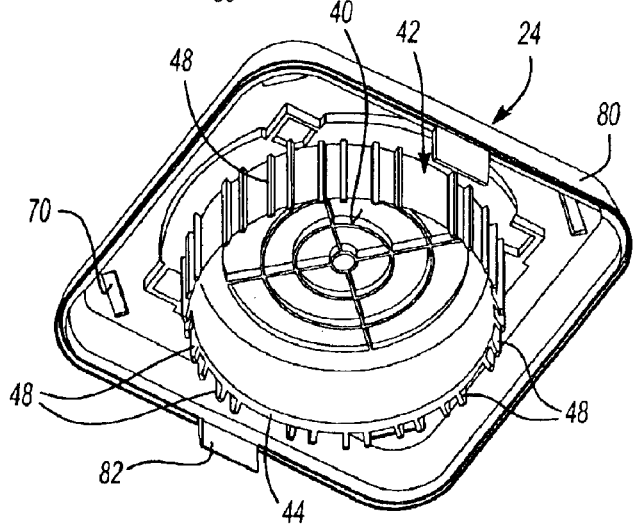
FIG. 2 is a perspective illustration of the portion of the embodiment of FIG. 1.
Figure 3:
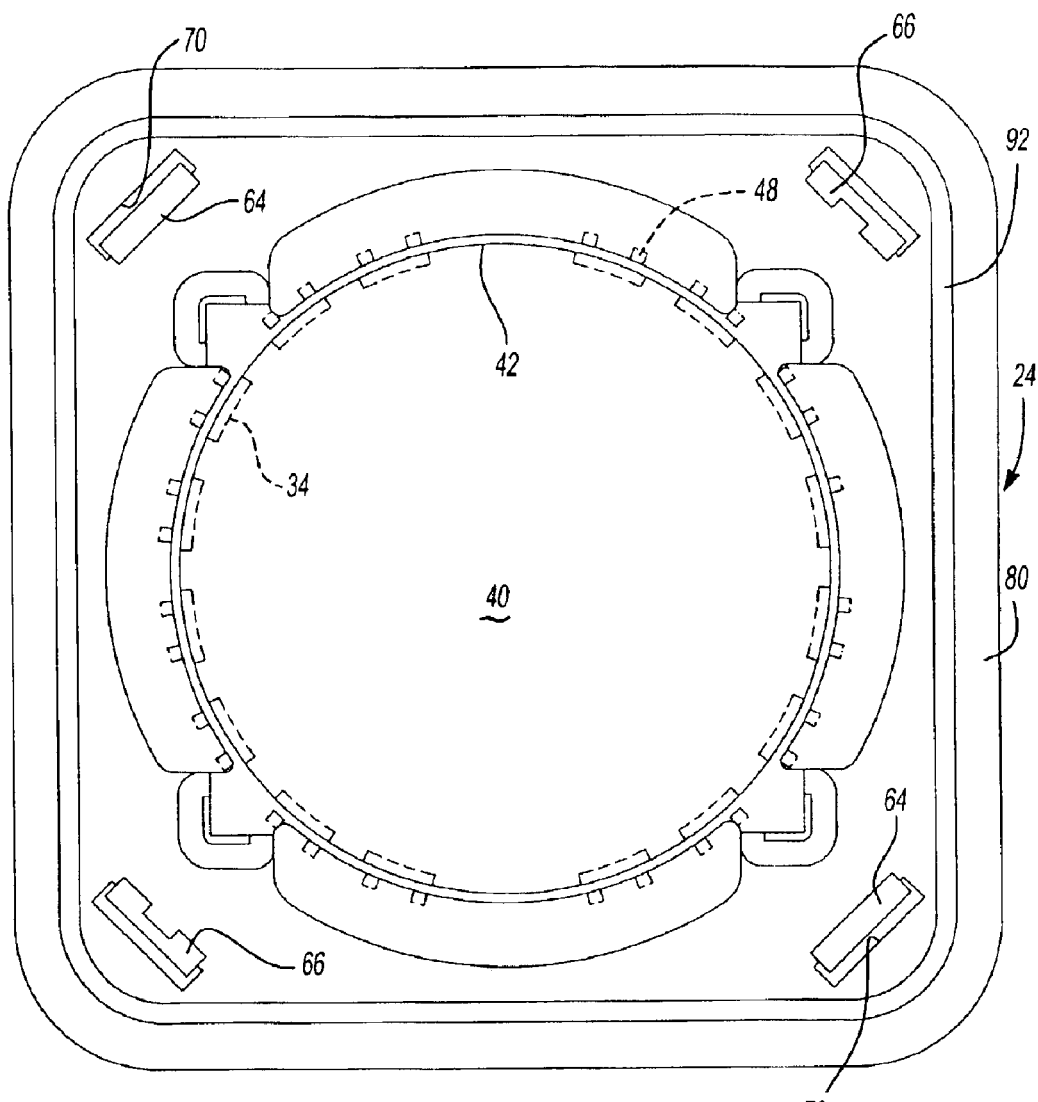
FIG. 3 is an elevational view of a selected portion of the embodiment of FIG. 1 when the container is in a closed condition.

The second member 24 is a top or lid portion in this example. The second member 24 includes an endwall 40 that establishes an opposite axial end of the container 20. FIG. 2 shows the second member 24 from an opposite perspective as that in FIG. 1. As best appreciated from FIG. 2, a sidewall portion 42 extends away from the endwall 40. The sidewall portion 42 cooperates with the sidewall portion 32 to provide a restraining portion of the container 20 that restrains or contains the wafers 26 (or whatever items) that are placed within the container 20.

Figure 4:
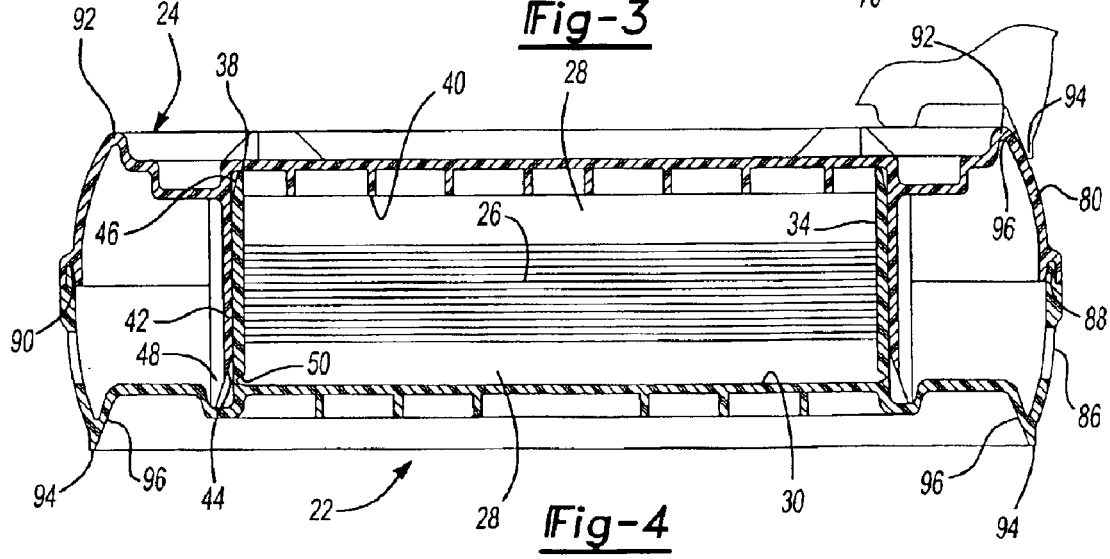
FIG. 4 is a cross-sectional illustration showing the embodiment of FIG. 1 in a loaded and closed condition.
Figure 5:
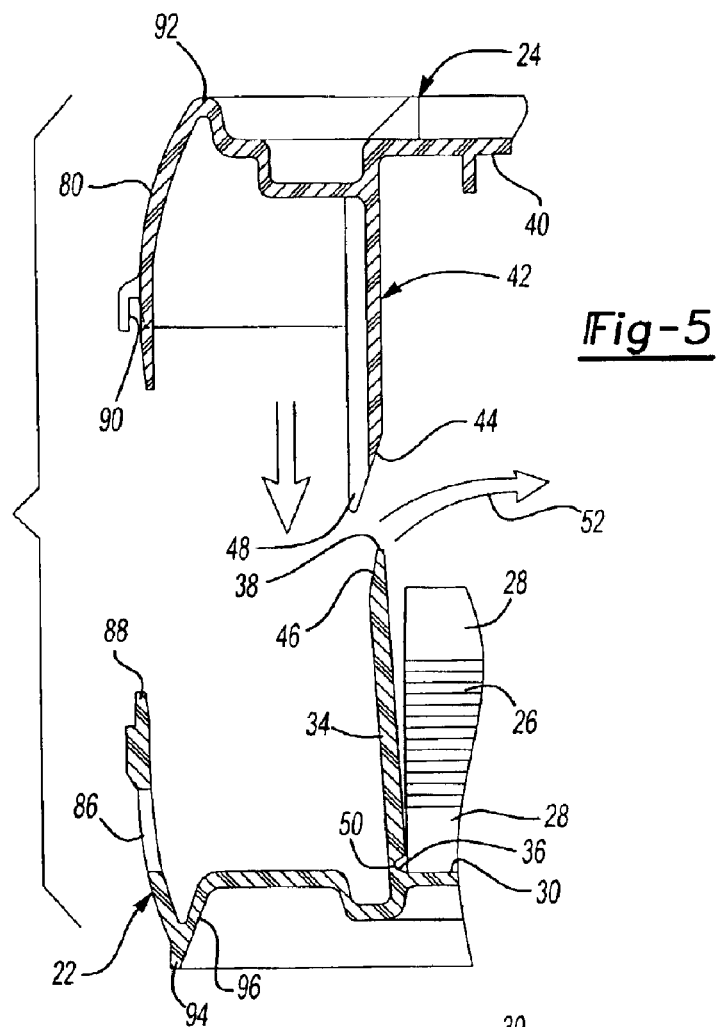
FIG. 5 is a partial, cross-sectional illustration showing cooperation between portions of the embodiment of FIG. 1 as the container is being closed.

As best appreciated from FIGS. 4 and 5, as the container 20 is closed (i.e., the first and second members 22 and 24 are brought together), the sidewall portion 42 is received about the outside of the sidewall portion 32. To facilitate the insertion of the sidewall portion 32 within the inside of the sidewall portion 42, the sidewall portion 42 includes a chamfered edge 44. A correspondingly chamfered edge 46 preferably is provided near the distal end 38 of the extensions 34.

The illustrated example includes closure assisting members 48 extending away from the endwall 42 that have a larger inside dimension than the chamfered edge 44 to facilitate gathering in any extensions 34 that may be situated such that it is difficult to capture them within the sidewall portion 42.

As best appreciated from FIG. 5, as the first and second members 22 and 24 are brought together, the example extensions 34 at least partially move relative to the endwall 30 such that the distal ends 38 move from a first position corresponding to the larger dimension at the open end to a second position corresponding to the nominal position at the open end (FIG. 4).

The illustrated example includes a hinge portion 50 adjacent the end 36 of the sidewall portion 32. Each hinge portion 50 allows the corresponding extension 34 to move responsive to the container being closed as schematically shown by the arrow 52.

Once the container is closed (FIG. 4) the same, nominal inside dimension (i.e., diameter) is provided at the end 38 and the end 36 of the sidewall portion 32. By appropriately sizing the nominal inside dimension, the restraining portion of the container absolutely restricts the items 26 and prevent any relative lateral movement between them. Once the vertical space between the endwalls 30 and 40 is appropriately filled and the container 20 is closed, there is no possible movement of the wafers 26 relative to each other during shipping or handling. Accordingly, the inventive container eliminates any undesirable movement of the wafers 26 during shipping and handling yet accommodates conventional loading techniques.

In this example container, there are locking members 60 that secure the first member 22 and the second member 24 together. A second set of locking members 62 are provided at the corners not occupied by the locking members 60. Each of the locking members 60, 62 extends from the endwall 30 of the first member 22. The locking members 60 include tab portion 64 at the ends, which are different than tab portions 66 provided at the ends of the locking members 62. The tab portions 64 and 66 are received within receiver openings 70 formed in the second member 24 to lock the container closed.

Figure 6:
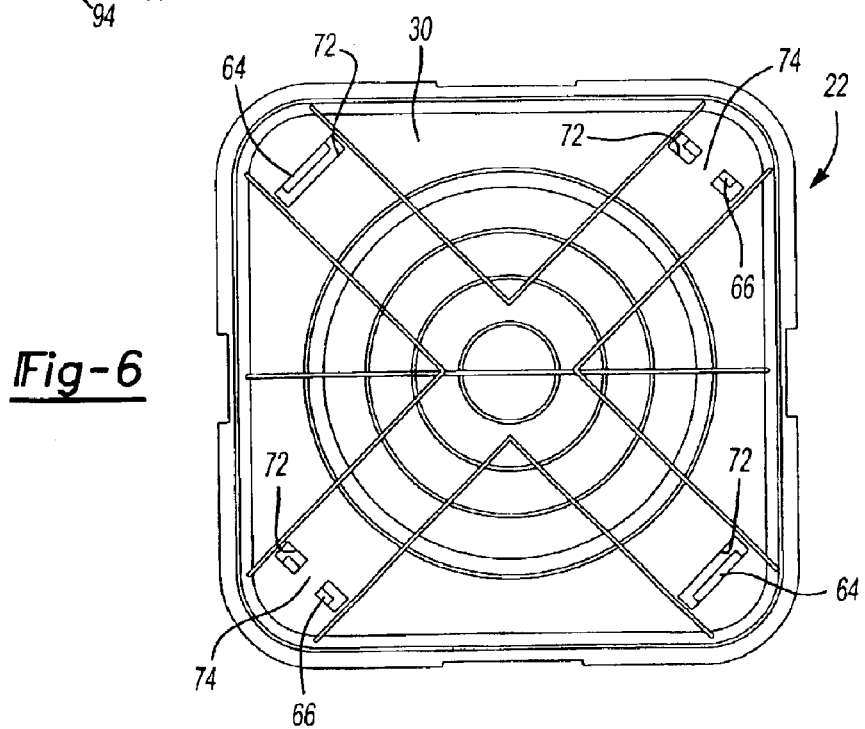
FIG. 6 is an elevational view of a selected portion of the embodiment of FIG. 1.

The difference between the tab portions 64 and 66 result from the molding technique used to make the example embodiment. As best appreciated from FIG. 6, a mold opening 72 exists in the endwall 30 of the first member 22 adjacent each locking member 60, which is used to facilitate forming the locking members. The openings 72 also are used in conventional machinery to locate or position the first member 22 for loading wafers 26 into the container. Conventional containers and conventional loading machinery use such openings for locating and positioning the container as needed.

The inventive arrangement in this example includes two additional locking members 62, which are adjacent openings 72'. The openings 72' are at least partially blocked by a cross member 74. Conventional locating or positioning machinery relies upon only two openings in the endwall 30. The cross members 74 prevent any misalignment or improper positioning because the machinery will not be able to use the openings 72' as the locating openings.

The example arrangement provides a more secure closure by having four locking members 60, 62 yet still provides the locating function or feature of the openings 72 in the endwall 30 of the first member 22.

Another feature of the example embodiment is that the first and second members have an exterior surface that provides a more closed appearance compared to conventional designs. The second member 24 includes a side surface 80 with extensions 82. When the first and second members 22 and 24 are secured together, the extensions 82 are received through slots 84 on the first member 22. A side surface 86 on the first member extends in a direction to meet the side surface 80 of the second member 24. The illustrated example includes a tongue-in-groove arrangement where a tongue portion 88 on the side surface 86 is received within a groove portion 90 on the side surface 80. This arrangement provides for a better closure mechanism to further ensure the security of the items packaged within a container.

Another feature is best appreciated from FIG. 4 where the container includes impact-absorbing "cushions" that are spaced away from the physical structure of the container that holds the wafers 26 in place (i.e., the wafer-restraining portion). The second member 24 includes a raised portion 92 while the first member 22 includes an extension portion 94. The outward surfaces of the portions 92 and 94 are axially spaced from the endwalls 30 and 40 so that when the container 20 is dropped or otherwise encounters a hard surface, the outer portions 92 and 94 (or the side surfaces 80 and 86, depending on the direction of impact) absorb at least some of the impact, which provides further protection for the wafers 26 within a container designed according to this invention.

Another feature of the example embodiment is shown in FIG. 4 where the extensions 94 have an inner, angled surface 96 that is adapted to cooperate with the extensions 98 on the first members 24. This provides a partially nested, stacking arrangement as can be appreciated from the upper right portion of FIG. 4. This facilitates stacking a plurality of the containers 20 in a convenient manner.

Other container embodiments are within the scope of this invention that include alternative ways of achieving the change in inside dimension at the open end of the restraining portion after the items have been loaded into the container.

FIG. 7 illustrates one example where the sidewall portion 34' on the first member 22' does not move as the container is closed. In this example, the sidewall portion 34' is rigid and remains stationary under all conditions. The nominal dimension of the interior defined by the sidewall portion 34' exists at the end 36' adjacent the endwall 30' while the larger dimension remains at the open end 38'.

A cooperating reducing portion 100, which extends from the endwall 40' of the second member 24' in this example, provides the nominal inside dimension on the inside at the distal end 38' when the container is closed. In this example, the reducing portion 100 has an interior surface 102 that includes the nominal inside dimension. An exterior surface 104 is at an oblique angle relative to the endwall 40'. An interior surface 106 of the sidewall portion 34' is at a corresponding oblique angle relative to the endwall 30'.

As can be appreciated from the drawing, once the container is closed, the reducing portion 100 of the second member 24' is at least partially received within the sidewall portion 34'. The inner surface 102 is received against the exterior of corresponding ones of the wafers within the container (not illustrated in FIG. 7). The surfaces 106 and 104 cooperate to provide a secure lateral arrangement between the sidewall portion 34' and the reducing portion 100. The sidewall portion 34' and the reducing portion 100 cooperate to provide the nominal inside dimension at the distal end 38' as the container is closed.

In another example, the reducing portion 100 is a separate ring that is received at least partially within the sidewall portion 34' at an appropriate time during the assembly procedure.

Another example arrangement is shown in FIGS. 8A and 8B where a reducing portion that comprises a band member 120 cooperates with the extensions 34 to draw them into the position where the extensions 34 have the nominal inside dimension along their entire length (i.e., where the distal ends 38 are drawn into the position to establish the nominal inside dimension at the distal, open end of the sidewall portion 34). In this example, the extensions 34 operate similar to those shown in FIGS. 1–5. The band member 120 is positioned around the extensions 34 and then tightened at an appropriate time to draw the distal end of the extensions 34 into position so that the extensions 34 engage the exterior of the wafers 26 as shown in FIG. 8. Accordingly, this example embodiment provides another arrangement where there is no possibility for lateral movement of the wafers 26 once the package is secured.

In one example, the band member 120 comprises a zip tie. In another example, the band member 120 comprises a strap. In another example, the band member 120 comprises tape.

As can be appreciated, this invention provides a container that securely maintains items such as semiconductor wafers in a desired alignment that restricts any movement of the items once the container is appropriately secured. By including a change in the dimension at the open end of the restraining portion of the container, the inventive arrangement allows for using conventional loading techniques and still provides a far-advanced securing arrangement to eliminate undesirable movement of items within a container.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A container for handling items such as wafers, comprising:

a first member having an endwall and a sidewall portion extending from the endwall, the sidewall portion having a nominal inside dimension adjacent the endwall and a greater inside dimension at a second end distal from the endwall when the container is in a first condition; and a second member that cooperates with the sidewall portion to establish the nominal dimension at the second end when the container is in a second condition, wherein the second member comprises a band member that is received about an exterior of the first member sidewall portion, to move the distal end of the sidewall portion inward.

2. The container of claim 1, wherein the sidewall portion is at least partially moveable such that at least the distal end is moveable between a first position corresponding to the greater inside dimension at the distal end and a second position corresponding to the nominal dimension at the distal end.

3. The container of claim 2, wherein the sidewall portion comprises a plurality of extensions with a hinged portion associated with each extension, at least a portion of each extension moving about the hinged portion between the first and second positions.

4. The container of claim 3, wherein the hinged portion is adjacent the endwall.

5. The container of claim 3, wherein the extensions are arranged in a generally circular pattern.

6. A container for handling items such as wafers, comprising:

a first member having an endwall and a sidewall portion extending from the endwall, the sidewall portion having a nominal inside dimension adjacent the endwall and a greater inside dimension at a second end distal from the endwall when the container is in a first condition; and a second member that cooperates with the sidewall portion to establish the nominal dimension at the second end when the container is in a second condition, wherein the first member sidewall portion has an inside surface that is at an oblique angle relative to the endwall and the second member has an outside surface that is received at least partially against the obliquely angled surface, the second member having an inside dimension corresponding to the nominal inside dimension of the sidewall portion.

7. The container of claim 6, wherein the second member outside surface is at the same oblique angle relative to the first member endwall when the second member is received by the first member sidewall portion.

8. The container of claim 6, wherein the sidewall portion is at least partially continuous and circular.

9. A container, comprising;

a first endwall;

a restraining portion having one end near the first endwall, the restraining portion establishing a first inside dimension near the first endwall and having a second, larger inside dimension near a second end of the restraining portion that is spaced from the first endwall when the container is in a first condition;

a reducing portion that cooperates with the restraining portion to reduce the inside dimension near the second end from the second dimension to the first dimension; and a second endwall near the second end of the restraining portion.

10. The container of claim 9, wherein the restraining portion is at least partially moveable such that the second end has the second inside dimension in a first position and the first inside dimension in a second position.

11. The container of claim 9, wherein the restraining portion and the first endwall are integrally formed from a single piece of plastic.

12. The container of claim 11, wherein the reducing portion and the second endwall are integrally formed from a single piece of plastic.

13. The container of claim 9, including locking members extending away from the first endwall and receivers associated with the second endwall, the locking members having ends that are at least partially received by the receivers such that the first endwall and the second endwall are spaced apart and locked together with the restraining portion extending across at least part of the spacing between the endwalls.

14. The container of claim 13, wherein the first endwall is generally rectangular with the locking members near each of the four corners of the first endwall and the first endwall has openings adjacent the locking members, at least two of the openings being partially blocked by a cross member.

15. The container of claim 9, wherein the restraining portion comprises a plurality of extensions having one end adjacent the first endwall, each extension being at least partially moveable between a first position corresponding to the first dimension at the second end and a second position corresponding to the second dimension at the second end and wherein the cooperating reducing portion extends from the second endwall and moves the extensions into the first position as the first endwall and the second endwall are moved toward each other.

16. The container of claim 9, wherein the reducing portion comprises a sidewall that is received at least partially about an exterior of the restraining portion, the sidewall moving the second end of the restraining portion inward as the sidewall is received about the restraining portion.

17. The container of claim 16, wherein the second endwall supports the sidewall.

* * * * *